US010453975B2

(12) United States Patent
Bettinelli et al.

(10) Patent No.: US 10,453,975 B2
(45) Date of Patent: Oct. 22, 2019

(54) PHOTOVOLTAIC CELL HAVING DISCONTINUOUS CONDUCTORS

(75) Inventors: Armand Bettinelli, Coublevie (FR); Eric Pilat, Brison-Saint-Innocent (FR)

(73) Assignee: Commissariat à l'Energie Atomique et aux Energies Alternatives, Paris (FR)

(*) Notice: Subject to any disclaimer, the term of this patent is extended or adjusted under 35 U.S.C. 154(b) by 524 days.

(21) Appl. No.: 13/819,432

(22) PCT Filed: Aug. 25, 2011

(86) PCT No.: PCT/EP2011/064671
§ 371 (c)(1),
(2), (4) Date: Feb. 27, 2013

(87) PCT Pub. No.: WO2012/028537
PCT Pub. Date: Mar. 8, 2012

(65) Prior Publication Data
US 2013/0160815 A1   Jun. 27, 2013

(30) Foreign Application Priority Data

Aug. 30, 2010  (FR) ..................................... 10 56853
Aug. 30, 2010  (FR) ..................................... 10 56854

(51) Int. Cl.
*H01L 31/02* (2006.01)
*H01L 31/05* (2014.01)
(Continued)

(52) U.S. Cl.
CPC ................ *H01L 31/022433* (2013.01); *H01L 31/02008* (2013.01); *H01L 31/0504* (2013.01); *H01L 31/0508* (2013.01); *Y02E 10/50* (2013.01)

(58) Field of Classification Search
CPC ....... H01L 31/022433; H01L 31/02008; H01L 31/02002; H01L 31/05; H01L 31/0504; H01L 31/0508; H02S 40/36
(Continued)

(56) References Cited

U.S. PATENT DOCUMENTS

| 4,301,322 A | 11/1981 | Amick |
| 4,542,258 A | 9/1985 | Francis et al. |

(Continued)

FOREIGN PATENT DOCUMENTS

| EP | 0 710 991 A | 5/1996 |
| EP | 0 729 189 A | 8/1996 |

(Continued)

OTHER PUBLICATIONS

Notification of the First Office Action issued by Chinese Patent Office for corresponding Chinese application 201180048827.4 dated Jan. 4, 2015 with English translation.
(Continued)

*Primary Examiner* — Eli S Mekhlin
*Assistant Examiner* — Dujuan A Horton
(74) *Attorney, Agent, or Firm* — Haug Partners LLP

(57) ABSTRACT

Photovoltaic device includes a wafer, wherein it comprises a plurality of discontinuous first conductors oriented in a first direction, which conductors are interrupted in interconnection zones, and in that at least one second conductor electrically connects the first conductors to one another in the interconnection zones, and in that it includes at least one metal strip or braid fastened to at least one electrical conductor, this at least one metal strip or braid including fastening zones in which it is mechanically and electrically connected to an electrical conductor and non-connected zones in which the metal strip or braid is not mechanically fastened to an electrical conductor.

29 Claims, 10 Drawing Sheets

(51) Int. Cl.
*H01L 31/18* (2006.01)
*H01L 31/0224* (2006.01)

(58) Field of Classification Search
USPC .................................... 136/243–265; 438/98
See application file for complete search history.

(56) References Cited

U.S. PATENT DOCUMENTS

| | | | |
|---|---|---|---|
| 4,590,327 | A | 5/1986 | Nath et al. |
| 5,726,065 | A | 3/1998 | Szlufcik et al. |
| 2009/0081823 | A1* | 3/2009 | Meeus .................. B41M 3/006 438/98 |
| 2010/0000602 | A1 | 1/2010 | Gray et al. |
| 2010/0126551 | A1* | 5/2010 | Okamoto .......... H01L 31/02242 136/244 |

FOREIGN PATENT DOCUMENTS

| | | | |
|---|---|---|---|
| EP | 1 981 090 A | | 10/2008 |
| JP | 2005-175399 | | 6/2005 |
| JP | 2005302902 A | * | 10/2005 |
| JP | 2009-295715 | | 12/2009 |
| WO | WO 00/44051 A | | 7/2000 |
| WO | WO 2005/098969 A | | 10/2005 |
| WO | WO 2006/137746 A | | 12/2006 |
| WO | WO 2008023795 A1 | * | 2/2008 ..... H01L 31/022425 |

OTHER PUBLICATIONS

Notification of Reason for Refusal issued in corresponding Korean Application No. 10-2013-7007855 dated May 9, 2018.

\* cited by examiner

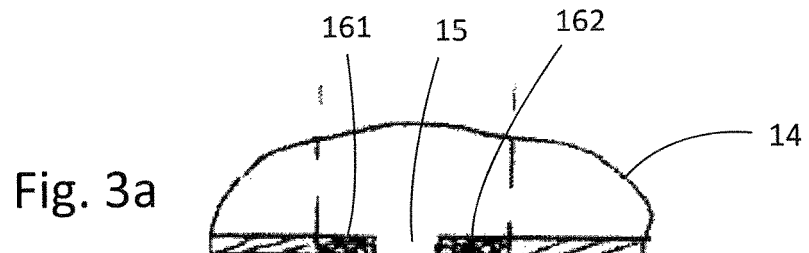
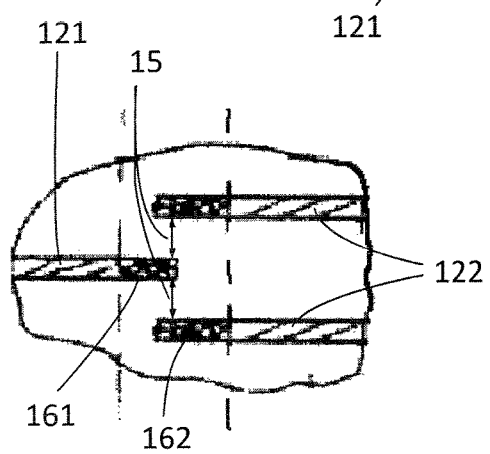
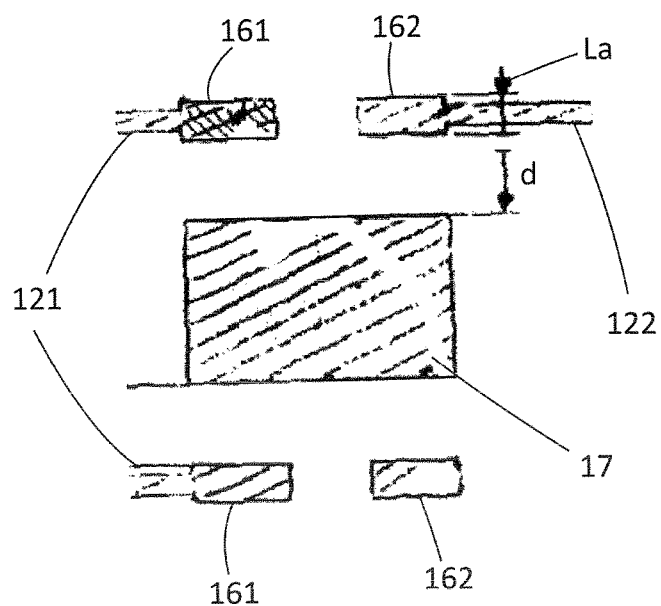

PHOTOVOLTAIC CELL HAVING DISCONTINUOUS CONDUCTORS

This application is a 371 of PCT/EP2011/064671 filed on Aug. 25, 2011, published on Mar. 8, 2012 under publication number WO 2012/028537, which claims priority benefits from French Patent Application Number 10/56853 filed Aug. 30, 2010 and French Patent Application Number 10/56854 filed Aug. 30, 2010, the disclosures of which are incorporated herein by reference.

BACKGROUND

The invention relates to a process for producing one or more electrical conductors on a photovoltaic device, this process being particularly suitable for producing collecting conductors on a photovoltaic cell, and to a process for manufacturing a photovoltaic cell incorporating such a process. The invention also relates to a unit for producing photovoltaic cells implementing such a process and to a photovoltaic cell per se obtained by such a process.

A photovoltaic cell is manufactured using a wafer made of a semiconductor, generally silicon. This manufacture in particular requires electrical conductors to be formed on the surface of the wafer. FIG. 1 illustrates the surface of such a wafer 1 according to the prior art, which comprises first parallel conductors of thin width, called collecting conductors 2 or collecting fingers, the function of which is to collect the electrons created in the silicon by light. In addition, the surface of the wafer 1 comprises other wider parallel conductors 3, generally called buses, oriented in a direction perpendicular to the collecting conductors 2, the function of which buses is to carry larger currents from photovoltaic cell to photovoltaic cell. All of these conductors 2, 3 are obtained by different techniques allowing continuous conductive lines to be formed, which lines extend continuously across the entire length and width of the wafer.

To produce these conductors, one prior-art method consists, for example, in screen-printing a conductive ink on the wafer, in one or two screen-printing steps. Such a process does not allow an ideal geometry to be obtained, especially as regards the uniformity of the height of the layer of ink deposited, and does not allow conductors with a sufficiently satisfactory performance to be formed. Specifically, the electrical performance of these conductors is very sensitive to their geometry, and especially to their thickness/width ratio, thickness being measured in the vertical direction perpendicular to the wafer 1, and width being measured in the horizontal direction, transverse to the conductor.

As a variant, document EP 0 729 189 suggests using another printing technique to produce these conductors, which technique consists in replacing the masking fabric used in screen-printing with a metal stencil in which through-apertures are produced. However, in order not to weaken these metal masks, and to obtain an optimized behaviour during printing, the area of the apertures is limited and the process requires at least two printed layers to be superposed using two separate, complementary masks. For this reason, this process remains complex and expensive.

Furthermore, the widest conductors 3 are in general covered with a metal strip, made of copper, the strip being soldered over its entire length, using a solder-covered copper strip. This strip extends across the entire length of the cell and serves to connect cells to one another, the strips of these cells being soldered in order to electrically connect a plurality of cells in order to form a photovoltaic module.

Such a copper strip is fastened to a photovoltaic cell by placing the strip on the conductor 3, then by bringing various soldering heads to bear, the transmitted heat of which, generally transmitted by infrared or hot air, allows the copper strip to be soldered over its entire length, the thermal conductivity of the strip promoting the transmission of the heat over its entire length, and therefore the continuous production of the solder joint. Thus, a copper strip soldered over the entire length of the conductor 3 is obtained on the front side of the photovoltaic cell.

Interconnection of a plurality of cells, in order to form a module, is also achieved by soldering the various copper strips. The temperature increase during these soldering steps and the different expansion coefficients of the various materials of a photovoltaic cell means that there is a risk of damage to the structure of the photovoltaic cells: specifically, sometimes micro-cracks appear in the structure of the silicon. In addition, the photovoltaic cells are also subjected to stress due to temperature variations during their ordinary use, which adds a risk of the cell deteriorating because of expansion effects. These risks increase with the thickness of the copper strip used and may lead to significant decreases in the performance of a photovoltaic device. Moreover, at the present time, cells are increasingly thinner and therefore increasingly sensitive to stresses, and the copper strips used are increasingly thicker in order to respond to the increase in current due to improvement in the conversion efficiency of these cells.

SUMMARY OF THE DISCLOSURE

Thus, a general objective of the invention is to provide a solution for producing an electrical conductor on a wafer of a photovoltaic device that alleviates the drawbacks of prior-art solutions.

More precisely, the invention seeks to achieve all or some of the following objectives:

A first objective of the invention is to provide a solution for producing an electrical conductor on a photovoltaic cell allowing the performance of the resulting photovoltaic cell to be optimized.

A second objective of the invention is to provide a solution for producing an electrical conductor on a photovoltaic cell, using a process that is effective and economical and enables a high production rate.

For this purpose, the invention relates to a solution for a photovoltaic device, which comprises a plurality of discontinuous first conductors placed on a wafer and oriented in a first direction, which conductors are interrupted in interconnection zones, and at least one second conductor that electrically connects the first conductors to one another in the interconnection zones. Furthermore, the solution uses at least one metal strip, or a braid, fastened to at least one electrical conductor, this at least one metal strip or braid comprising fastening zones in which it is mechanically and electrically connected to an electrical conductor and non-connected zones in which the metal strip or braid is not mechanically fastened to an electrical conductor.

The invention is more particularly defined by the claims.

BRIEF DESCRIPTION OF THE FIGURES

These objectives, features and advantages of the present invention will be discussed in detail in the following description of particular non-limiting embodiments given with regard to the appended figures among which:

FIG. 3a shows an enlarged zone, called the interconnection zone, for conductors on the surface of a photovoltaic cell according to the first embodiment of the invention.

FIG. 3b shows an enlarged zone of the interconnection zone for conductors on the surface of a photovoltaic cell according to a first variant of the first embodiment of the invention.

FIGS. 4 to 7 schematically illustrate the interconnection zone for conductors on the surface of a photovoltaic cell, respectively according to four variants of the first embodiment of the invention.

DETAILED DESCRIPTION

The invention makes possible the particular use of what is called the "stencil" process since it uses a stencil, allowing the electrical conductors to be obtained on the surface of a photovoltaic cell in a single printing step. Thus, the invention has the two-fold advantage of allowing effective conductors of uniform thickness to be obtained by virtue of the stencil process, while remaining economical. To do this the invention is based on the concept of producing discontinuous conductors that advantageously have particular geometries in their discontinuous zones, so as to allow effective subsequent electrical connection and sufficient mechanical strength to be guaranteed.

The invention in fact defines a geometry for the conductors that represents an optimal compromise between the need to obtain a conductor geometry providing a high electrical and mechanical performance and the need to limit the size of the apertures in the metal sheet used, so as to ensure continued compatibility with the stencil printing process.

Figure 1:
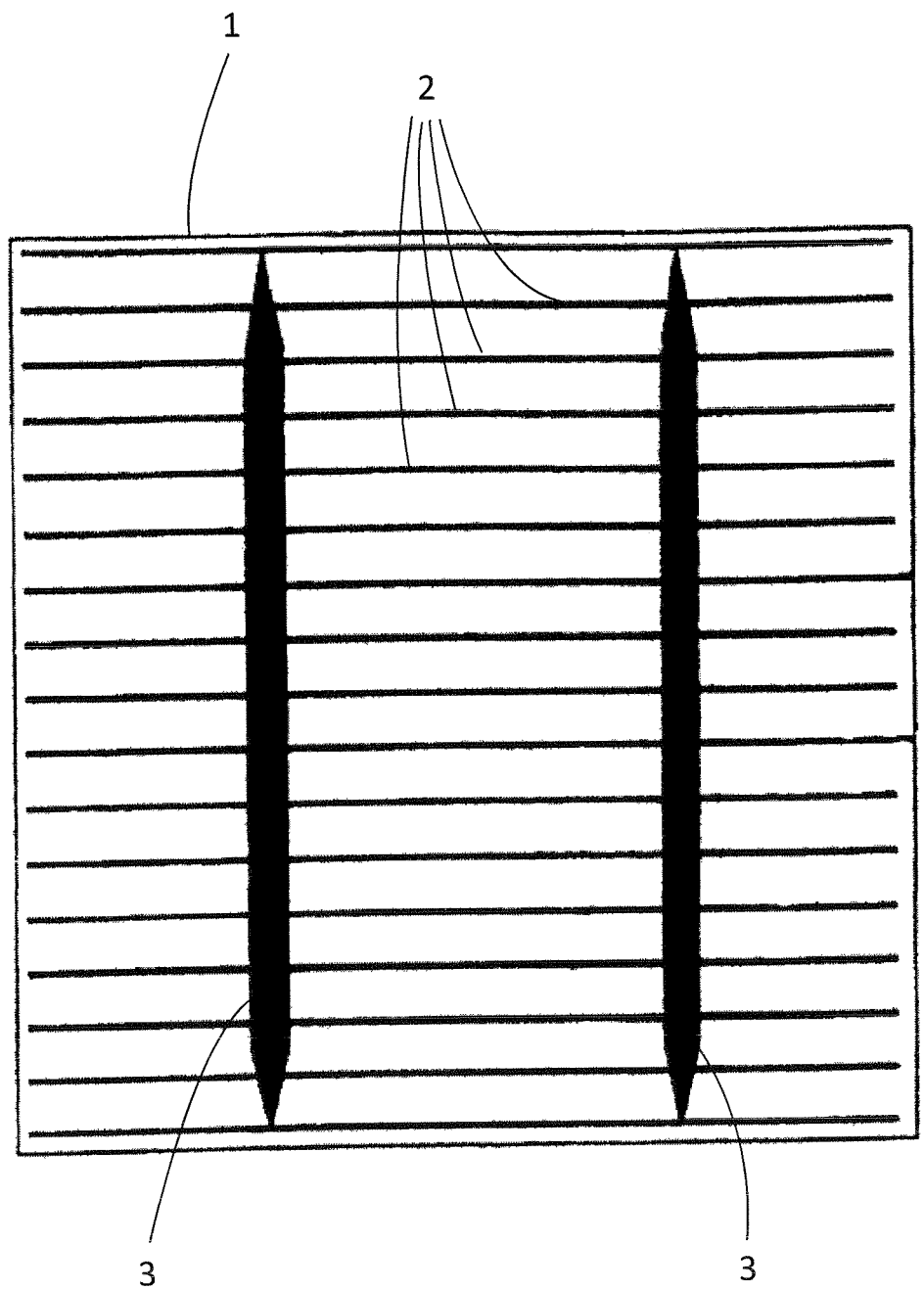
FIG. 1 schematically illustrates conductors on the surface of a photovoltaic cell according to the prior art.
Figure 2:
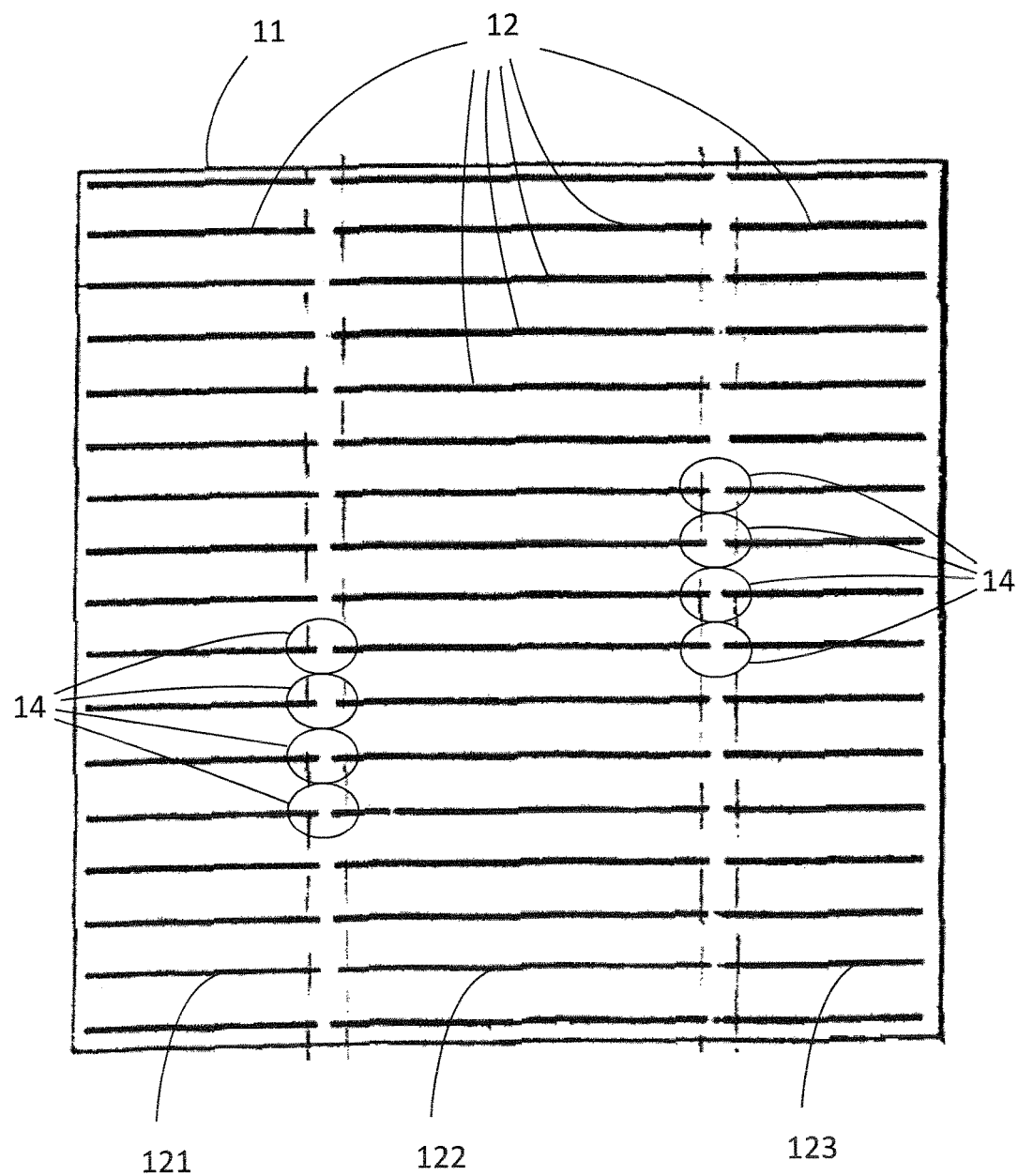
FIG. 2 schematically shows a portion of the conductors on the surface of a photovoltaic cell according to a first embodiment of the invention.

FIG. 2 shows a first embodiment of the invention in which each collecting conductor 12, obtained by stencil printing, is discontinuous, and in fact is made up of three separate segments 121, 122, 123 that are substantially aligned so as to extend across the entire width of the wafer 11. These segments 121, 122, 123 may be 0.07 to 0.12 mm in width, or even less than 0.07 mm in width, about 0.03 to 0.06 mm in width for high-performance cells. This multitude of parallel collecting conductors 12, which form first conductors 12, thus defines what are called interconnection zones 14 in which the conductors 12 are interrupted between two segments 121, 122 and 122, 123. The various interconnection zones 14 of the various collecting conductors 12 are aligned in a different direction to that of the collecting conductors 12, substantially perpendicular to the collecting conductors 12, in order to allow them to be electrically connected using at least one second conductor, for example a copper strip (not shown), which will be described below, covering them so as to electrically connect them and finally forming a perpendicular conductor corresponding to the conductors 3 shown in FIG. 1.

FIG. 3a more particularly shows an interconnection zone 14 between two segments 121, 122 of a collecting conductor 12. Each segment 121, 122 has an end 161, 162, respectively, that faces the other, these two ends being separated by a gap 15. These ends represent electrical connectors. This is because they are intended to be covered by a metal strip, for example made of copper, of width L, which covers the entire width L of the interconnection zone 14 and forms an electrical connection between the two segments 121, 122 in the interconnection zone 14, and an electrical connection between the various collecting conductors 12 by extending over the entire length of the wafer 11.

Naturally, the interconnection zones 14 between the segments 122, 123 of the collecting conductors 12 have the same geometry, and are likewise intended to be electrically connected by a second metal strip. The gap 15 must be sufficiently large for the printing mask used to remain stiff: for this reason it is at least 0.25 mm in size, for example preferably equal to 0.5 mm in size.

FIG. 3b shows a variant in which the various segments 121, 122 are shifted and not aligned so as to be separated by a gap 15 of at least 2 mm in a direction perpendicular to the segments.

FIG. 4 illustrates a first variant of an interconnection zone 14, in which each segment 121, 122 has at its end electrical connectors 161, 162 with a particular geometry, these connectors 161, 162 being larger than the conductors 121, 122. Specifically, each electrical connector has a larger width La of about 0.2 mm so as to obtain, finally, a substantially rectangular geometry of length equal to about 0.65 mm and width equal to 0.2 mm.

In addition, this first variant comprises additional metallized lands 17 provided between the electrical connectors 161, 162 and between two parallel and juxtaposed collecting conductors 12, the function of which is to increase strength in the interconnection zones 14, without any electrical role. Thus, the metallized zones 161, 162, 17 provided in the interconnection zones 14 have sufficient area to withstand the assembly stresses and withstand the stresses endured during operation of the photovoltaic cell, such as stresses due to differential expansion of various materials.

The electrical connectors 161, 162 have sufficient area to electrically connect the various segments 121, 122 of the collecting conductors 12. In order to preserve the mechanical integrity of the metal stencil used in production of these metal deposits on the surface of the wafer 11, in a single operation, the additional metallized lands 17 are separated from the electrical connectors by a distance d of more than 0.25 mm, preferably of about 0.5 mm.

Of course, the electrical connectors and the additional metallized lands may have many other shapes or be of different sizes without departing from the scope of the invention. In particular, these shapes and sizes may advantageously be tailored to the type of connection chosen for fastening the metal strip onto their surface.

Figure 5:
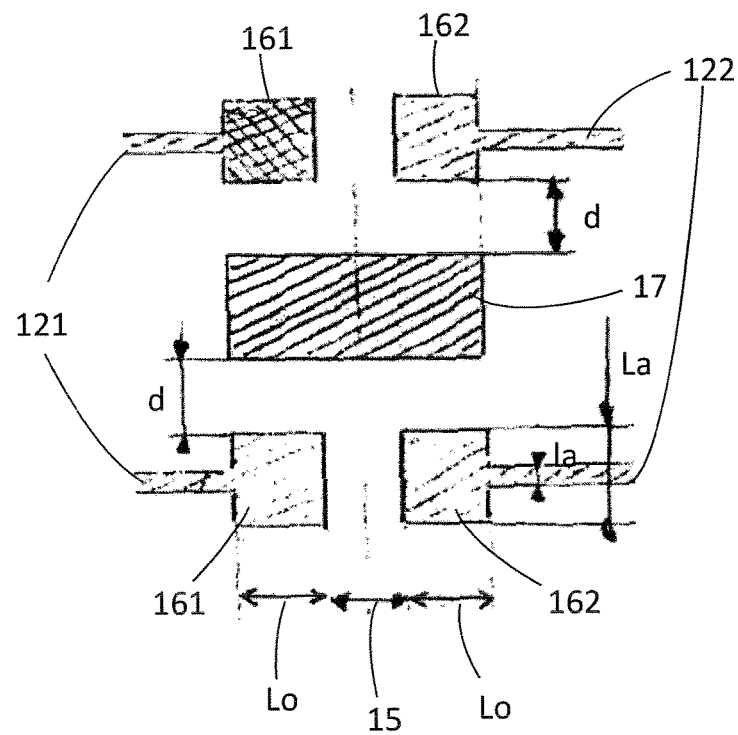

FIG. 5 illustrates a second variant, in which the electrical connectors 161, 162 have a larger rectangular area of width La of about 0.5 mm and length Lo of about 0.65 mm. These electrical connectors 161, 162 remain separated by a gap 15 of about 0.5 mm. In addition, the intermediate metallized land 17 has a smaller area, so as to remain a distance d of at least 0.25 mm, preferably of about 0.5 mm, from the electrical connectors 161, 162, again to preserve the stiffness of the mask used. The conductor segments 121, 122 have a width la of 0.07 mm.

The two variants shown in FIGS. 4 and 5 are well tailored for fastening a metal strip by soldering, by nature having a very small resistance.

Figure 6:
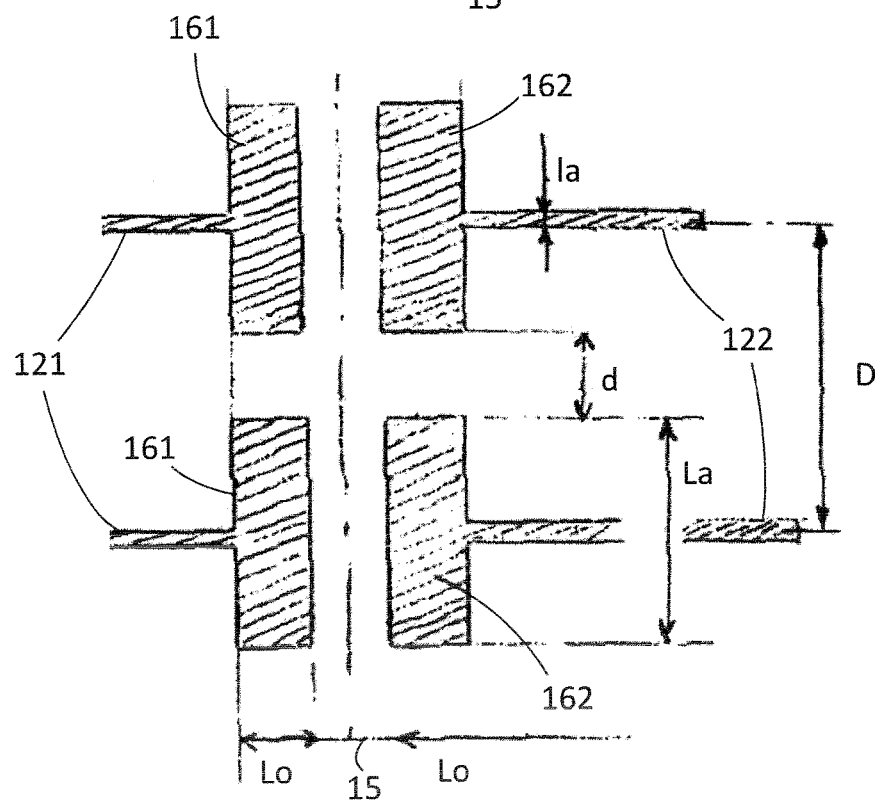

FIG. 6 illustrates a third variant, particularly suitable for fastening a metal strip by adhesive bonding, using a conductive adhesive. In this variant, the electrical connectors 161, 162 have a substantially larger area in order to compensate for the resistance due to the adhesive. For this reason they have a rectangular shape, which shape is elongate in the direction perpendicular to the collecting conductors 12, and dimensions of about 0.65 mm (Lo) by 1.5 mm (La). The ends of these electrical connectors 161, 162 of two segments 121, 122 of parallel and juxtaposed collecting conductors remain separated by a distance d of at least 0.25 mm, 0.5 mm in this embodiment, in order to preserve the stiffness of the stencil used to produce them. The gap 15 likewise remains about 0.5 mm. The conductors 121, 122 have a width of 0.07 mm and two parallel collecting conductors 12 are spaced apart by a distance D of about 2.1 mm.

Figure 7:
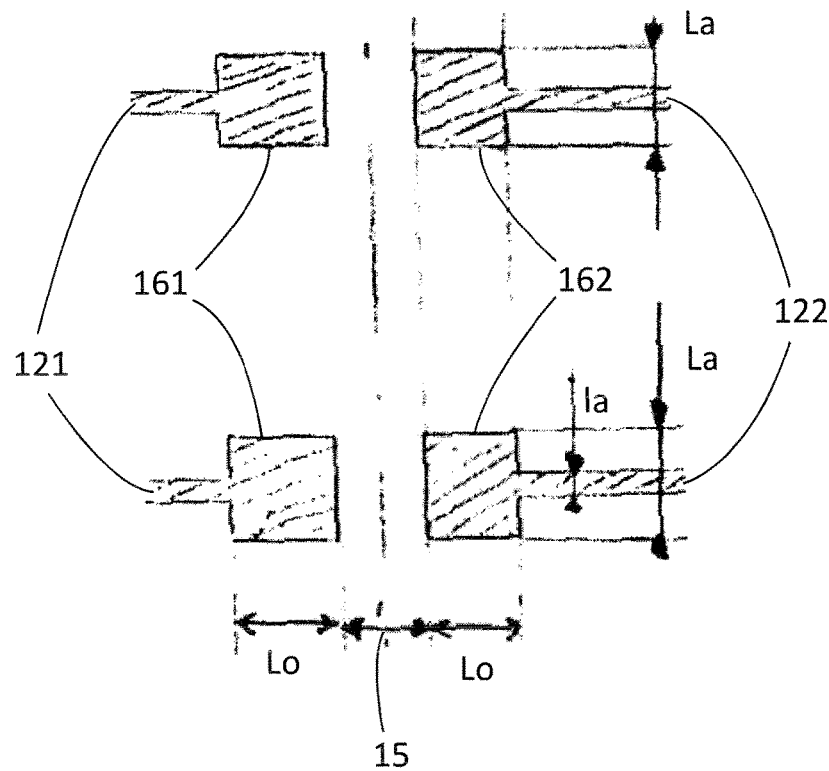

In the fourth variant shown in FIG. 7, the electrical connectors have a smaller rectangular shape 0.65 mm by 0.70 mm in size. The distance between two electrical connectors 161, 162 of two different aligned segments is again larger than 0.25 mm, being about 0.50 mm.

With the geometry of the electrical connectors 161, 162 of the latter two variants, there is no need to add additional metallized lands 17, the electrical connectors 161, 162 having sufficient area to meet the two-fold electrical and mechanical requirements. The electrical connectors in the variant in FIG. 7 have a smaller area than that of the electrical connectors of the variant in FIG. 6. The former will be preferred in cases where a particular adhesive is used, adhering differently to metallized and non-metallized zones, and especially providing better adhesion to non-metallized zones.

Naturally, any other fastening means other than soldering or adhesive bonding could, as a variant, be used to fasten a metal strip, such as a copper strip, in order to cover the interconnection zones. In addition, as a variant, any conductor element other than a metal strip could be used to form the electrical connection in the interconnection zones, i.e. in the zones of discontinuity in the conductors produced, such as additional conductors produced by screen-printing with a screen or by an additional stencil step, or using a metallized sheet, or any other contactless method such as ink-jet printing.

Figure 8:
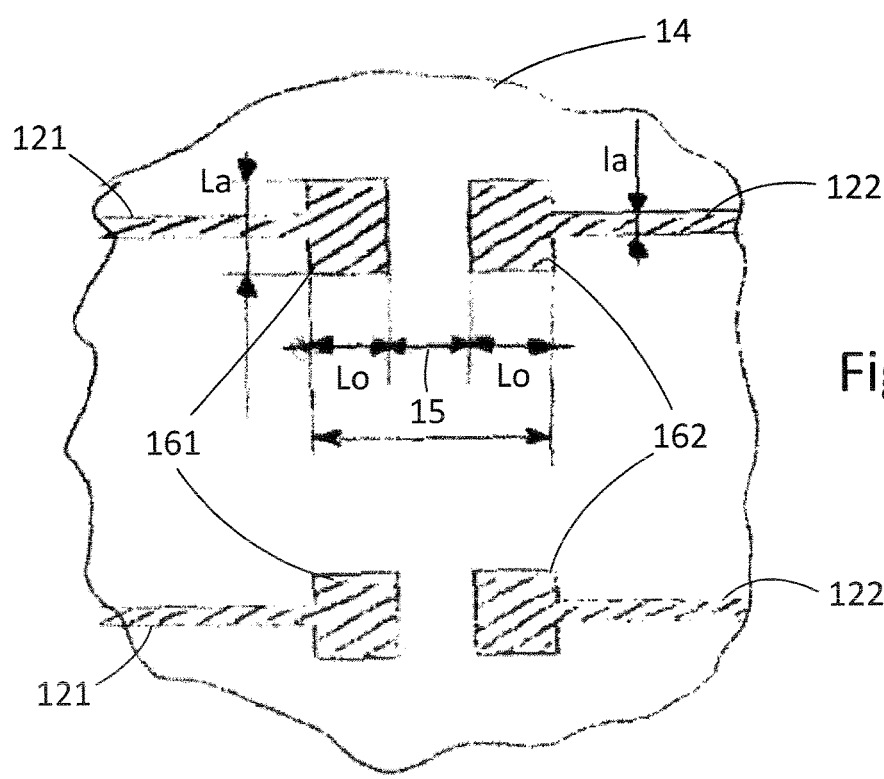
FIGS. 8 to 10 schematically illustrate the interconnection zone for conductors on the surface of a photovoltaic cell in various printing steps according to a second embodiment of the invention.
Figure 9:
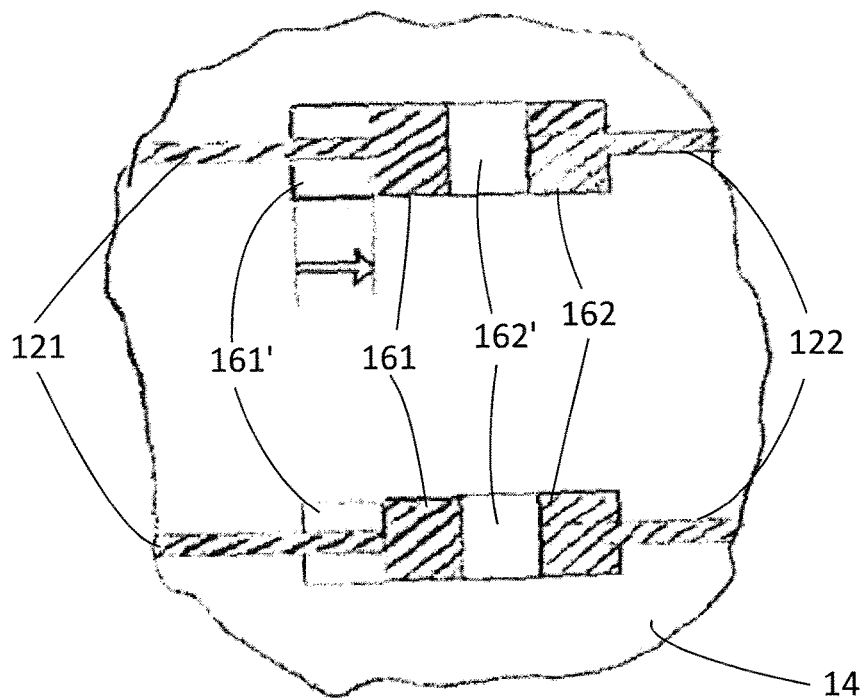
Figure 10:
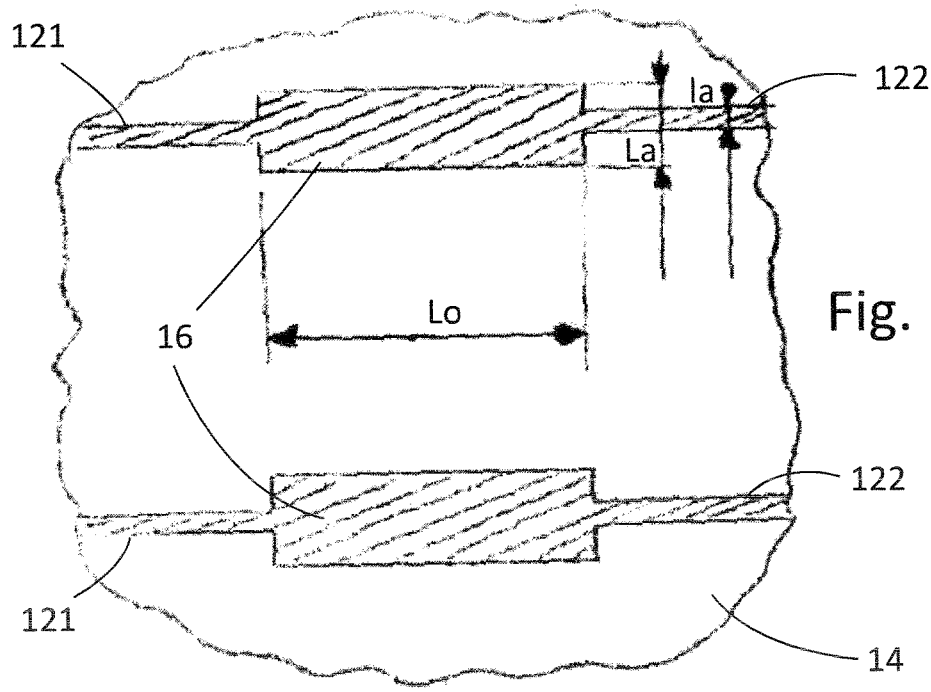

FIGS. 8 to 10 illustrate a second embodiment in which the conductors 12 are formed in two complementary printing steps using two different stencils. In this particular embodiment, the second printing step fills the voids in the metallization of the first printing step.

FIG. 8 thus more precisely shows the geometry obtained in the first printing step using a first stencil, in which printing step the conductor segments 121, 122 produced have mutually facing unconnected wider electrical connectors 161, 162 at their ends. In this embodiment, the electrical connectors have a width La of 0.5 mm and a length of 0.45 mm. They are spaced apart by a gap 15 of 0.45 mm. This first printing step is similar to the printing step carried out in the first embodiment of the invention.

FIG. 9 shows the imprint produced in the second printing step, which is shifted in the interconnection zone 14 by about 0.45 mm so as to form areas 161', 162' in order to produce, finally, a continuous metallization 16 in the direction of the conductors 121, 122, having a total length Lo of 1.8 mm and a width (La) of 0.5 mm, shown in FIG. 10. These metallizations in the interconnection zones 14 are then connected to one another by any electrical means, such as for example a metal strip such as described above. It will be noted that these metallizations remain discontinuous in a vertical direction.

This double printing may also be used to produce the collecting conductors 121, 122. Specifically, these conductors may be produced by a succession of segments produced, in alternation, in the first and in the second printing step, by maintaining a zone of overlap to ensure their electrical continuity. This allows the stiffness of the printing masks to be increased, each mask thus having shorter apertures, spaced apart however by a minimum distance.

Of course, the invention is not limited to the shapes shown for the electrical connectors at the discontinuous ends of the first conductors, the conductor segments, and the additional metallized lands. In particular, the latter may have any shape other than a rectangular shape, and may take the form of an association of a number of separate complementary areas placed between each collecting conductor. The electrical connectors could have other dimensions, advantageously a width of 0.2 mm or more and/or a length of 0.4 mm or more, and be a shape that is not necessarily rectangular. The ends of the collecting conductors 121, 122 could gradually widen to the width of the electrical connectors 161, 162 mentioned above. According to a variant shown in FIG. 3a, the electrical connectors may even have a similar, or even identical, width to that of the conductor segments. The latter are collecting conductors in the examples described above. However, the invention remains applicable to other types of conductor. In addition, these conductors may have other shapes that are not necessarily rectangular, and may have any number of discontinuities.

The invention has been described for the production of conductors on the surface of a photovoltaic cell. It is particularly suitable for conductors arranged in an H-shape, i.e. comprising a number of different conductors connected to one another and having substantially perpendicular directions. It is compatible with any type of cell, especially heterojunction (HET) cells on which metallizations are deposited on a transparent conductive oxide.

The invention also relates to a process for producing an electrical conductor on a wafer using a metal stencil, characterized in that it comprises the following steps:

printing a layer of conductive ink on the surface of the wafer through the stencil so as to form a plurality of first conductors in a first direction, these conductors being discontinuous and interrupted in at least one interconnection zone; and producing an electrical connection by covering the interconnection zones of the first conductors with at least one second conductor.

The latter step is advantageously achieved by fastening a metal strip by soldering or adhesive bonding. It will be noted that the above embodiments have been described with a strip or braid playing the role of the second conductor, this strip or braid being fastened directly to the collecting conductors such as described in detail above. However, as a variant, it may be envisaged to produce the second conductors 3 by screen-printing, in the same way as in the prior art, a strip 13 or braid then being added to these second conductors.

In addition, the invention also relates to a process for manufacturing a photovoltaic cell, characterized in that it comprises producing an electrical conductor on a wafer using the process described above. The invention thus allows photovoltaic modules to be formed by connecting a number of the photovoltaic cells thus obtained, and photovoltaic arrays, for producing electricity, to be assembled by combining such photovoltaic modules.

The solution of the invention finally has the following advantages:
- a printing process using a stencil allows conductors of substantial thickness to be obtained, with a high and uniform thickness/width ratio, thereby guaranteeing their good electrical performance;
- it is suitable for producing conductors in a single stencil printing step, which makes it economical and rapid; and
- it reduces the amount of ink used, which may be silver, and thus reduces overall cost.

The second aspect of the invention relates to the strip 13 or braid added to the photovoltaic cell, in a direction substantially perpendicular to the collecting conductors described above.

Figure 11:
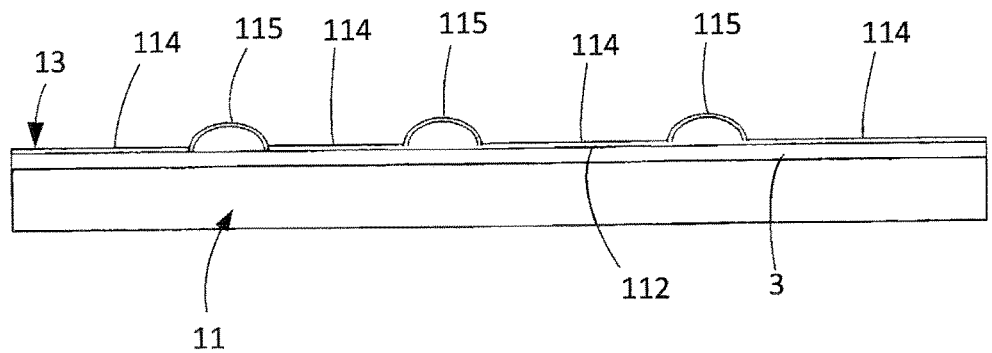
FIG. 11 schematically shows a cross-sectional view through a bus of a photovoltaic cell according to a first embodiment of the invention.

FIG. 11 shows the structure of a photovoltaic cell in cross section according to one embodiment of the invention, more particularly in order to illustrate the fastening of the copper strip 13 intended to carry the electrical charge. This strip 13 is discontinuous and has, in alternation, fastening zones 114, which comprise the interconnection zones 14 in this embodiment, in which fastening zones the strip is connected to a bus 3 of the cell, and non-connected zones 115 in which the strip is not fastened to the cell. It will be noted that this bus 3 is optional, as was described above. In addition, the fastening zones 114, where the strip 13 is fastened to the cell, preferably correspond to the interconnection zones 14 defined beforehand by the position of the collecting conductors. These fastening zones 114 can however extend beyond this interconnection zone 14.

Moreover, in the particular case where a separate intermediate bus 3 is added, as shown, these fastening zones 114 could, as a variant, not correspond to the interconnection zones 14. This geometry allows the residual stresses in the fastening zones 114, where the strip 13 is fastened to the cell, to be reduced by decreasing the connection lengths. It will be noted that this strip therefore covers a conductor bus 3, and is fastened to this bus 3 by any conductive fastening means 112. This assembly is fitted to a wafer 11 of the photovoltaic cell. The strip chosen is a copper strip, though any metallic strip 13 could, as a variant, be used.

Advantageously, the length of the fastening zones 114 is shorter than 15 mm, indeed even shorter than 5 mm, so as to obtain a significant reduction in the expansion stresses at the interface. These fastening zones 114 are then multiple and of short length.

Furthermore, the non-connected zones 115 of the strip 13 are advantageously longer than the distance between the two successive fastening zones 114 surrounding it, in order to promote deformation of the copper portions that are not connected to the cell, and to provide better mitigation of the expansion effects.

It will be noted that the presence of an elongate length of strip 13 on the photovoltaic cell runs counter to the practice of those skilled in the art because it involves more complex alignment, and more generally a more complex manufacturing process, and thus an additional cost.

In order for the strip 13 to have a configuration that allows it to expand or contract as best as possible in the zones 115 that are not fastened to the cell, with a minimum of stress, it is advantageous to use a preformed copper strip or a copper braid. The latter solution will be described in greater detail below.

Figure 12:
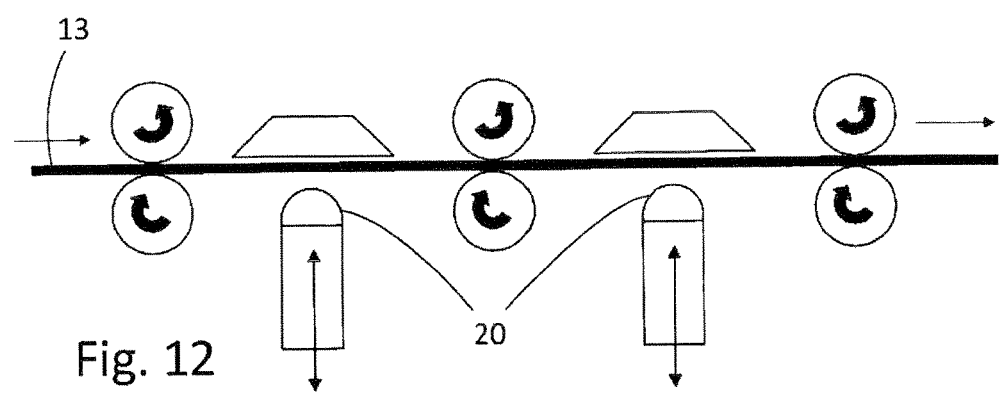
FIG. 12 shows a process for preforming a metal strip by punching.
Figure 13:
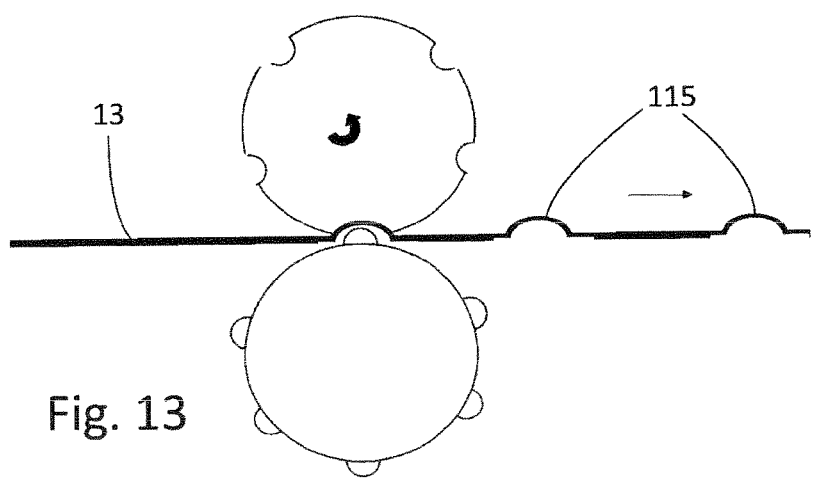
FIG. 13 shows a process for preforming a metal strip by embossing.

FIG. 12 illustrates a first process for preforming or corrugating the copper strip using a matrix composed of punches 20 spaced apart depending on the pitch chosen for the zones 115. As a variant, FIG. 13 illustrates an embodiment in which this preforming is an embossing step forming embossed zones 115. These prior steps allow a strip that is corrugated in its thickness, i.e. in a vertical direction perpendicular to the plane of the wafer 11, to be obtained, as may be seen in FIG. 11.

Figure 14:
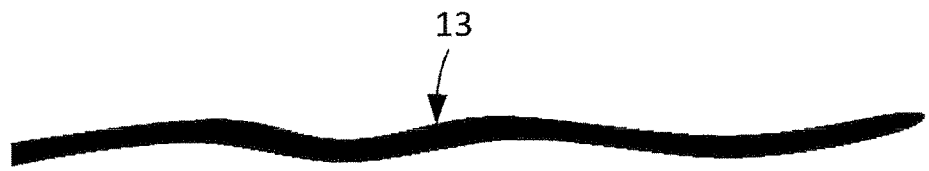
FIG. 14 shows a top view of a metal strip preformed according to the invention.

It will be noted that the strip may also be corrugated in another direction, such as a lateral direction, in the plane of the wafer 11, as is shown in FIG. 14.

The metal strip has been fastened by a fastening means 112, which may be a solder. As a variant, it is possible to use a conductive adhesive and a copper strip that is not coated with an alloy that melts at the polymerization temperature. The use of an adhesive allows the interconnection zone to be localized. In addition, this type of connection is more flexible than solder for example.

Advantageously, the fastening zones 114 are positioned relative to the conductors of the photovoltaic cell so as to optimize the electrical performance of the solution. To do this, provision is made to limit the electrical charge passed through conductors with a higher resistance than the copper strip 13, i.e. it is arranged for the path travelled by this charge in the conductors of the cell to not be lengthened.

The preferred solution thus consists in positioning the fastening zones 114 on the collecting conductors 12, as was seen above, so that they correspond to the interconnection zones 14. As these collecting conductors 12 are in general parallel and spaced apart by a constant pitch p, the fastening zones 114 can be distributed over the strip 13 with a constant pitch P so as to correspond to the collecting conductors 12.

Figure 15:
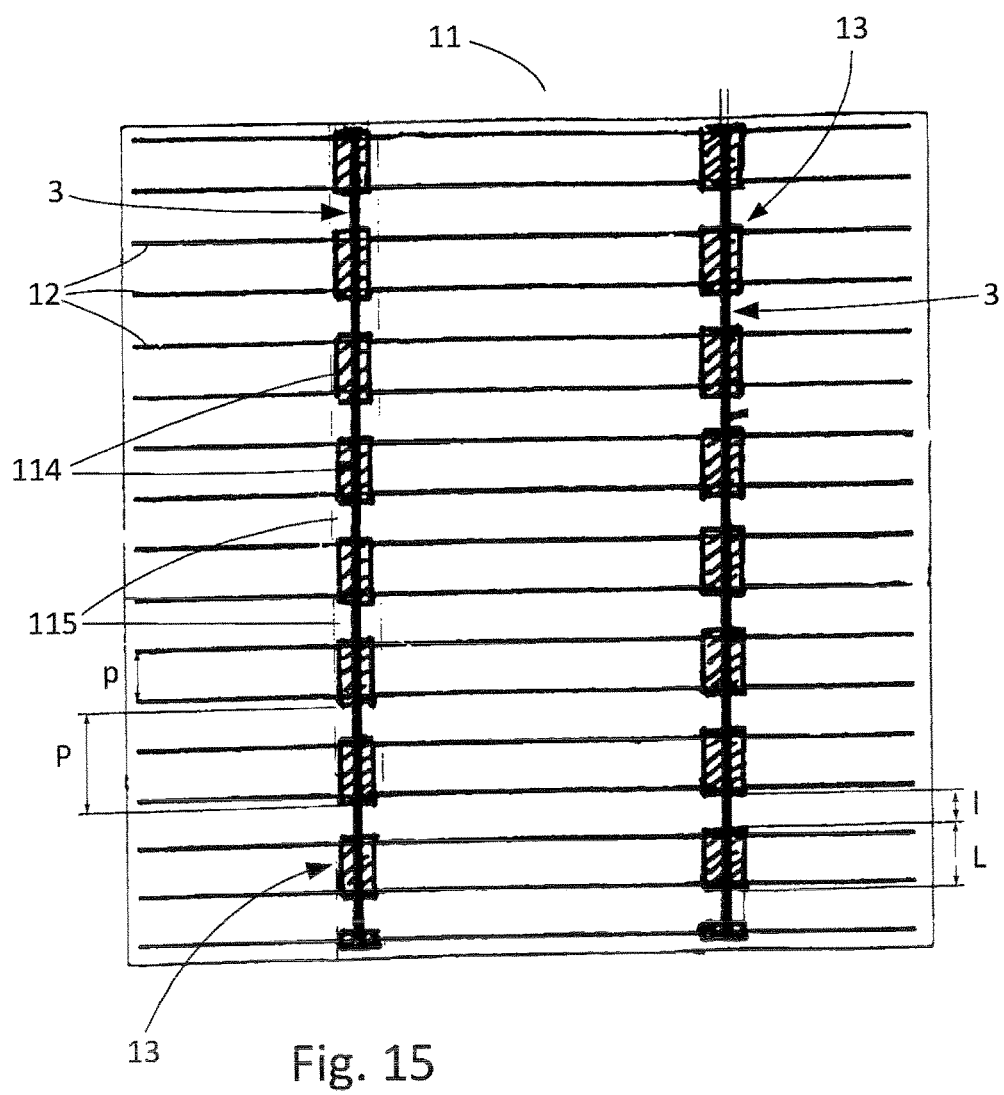
FIG. 15 shows a top view of a wafer according to one embodiment of the invention.
Figure 16:
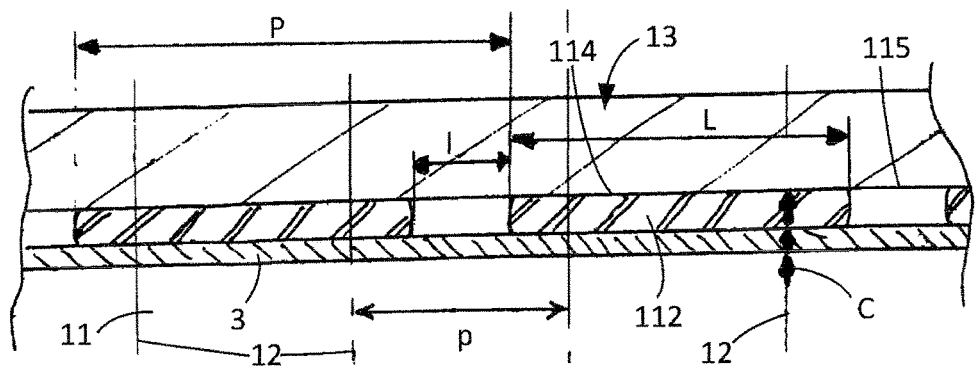
FIG. 16 shows from the side a wafer in cross section according to one embodiment of the invention.

FIGS. 15 and 16 thus illustrate an advantageous embodiment, for a wafer 11 comprising collecting conductors 12 distributed with a pitch p, and two perpendicular buses 3, arranged with a conventional geometry, such as illustrated in FIG. 1. These two buses 3 are covered with a metal strip 13 according to the invention. The fastening zones 114 of this strip are separated by a pitch P that is a multiple of p, so that all the collecting conductors 12 are located under a fastening zone 114 when level with the buses 3, so as thus to promote the transfer of electrical charge C from the collecting conductors 12 to the metal strip 13 through the conductive fastening means 112. Advantageously, the pitch P of the fastening zones may be identical to that of the collecting conductors. It will be noted that this pitch P corresponds to the sum of the length L of a fastening zone 114 and the length I between two fastening zones 114.

Figure 17:
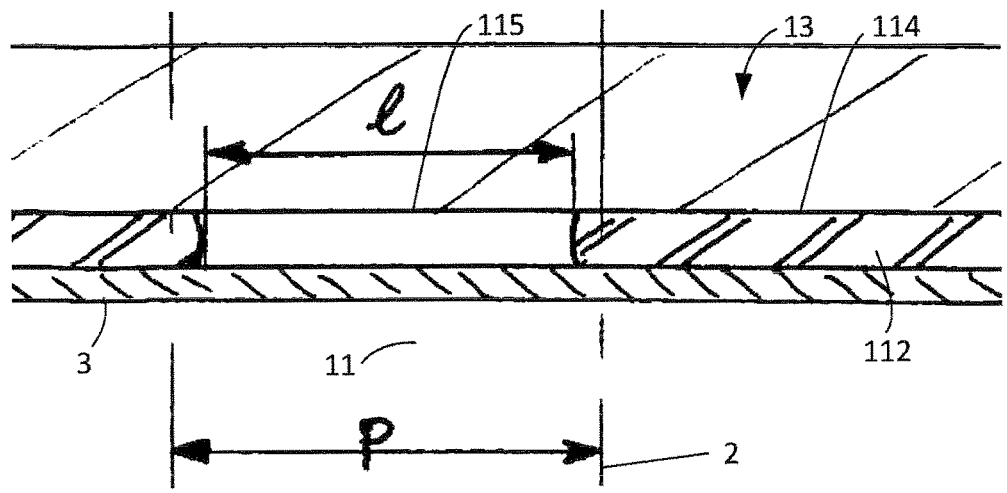
FIG. 17 shows from the side a wafer in cross section according to a variant of the embodiment of the invention.

It will be noted that the distance I between two fastening zones 114, where the strip 13 is fastened to the wafer 11, must not be too small, so as to allow for sufficient deformation of the strip, and not too large, so as to match the separation between collecting conductors 12 according to the principle explained above. An advantageous compromise may consist in making this length I equal to or approximately equal to the pitch p of the collecting conductors 12, this length lying in a range p−20% p≤I≤p, as is shown in FIG. 17.

Naturally, the invention may also be implemented with a strip having fastening zones 114 that are different from one another, for example of different length L, and having non-connected zones 115 of different length I.

The invention has been described for advantageous fastening of a metal, preferably copper, strip to the conductors of a photovoltaic cell. However, it is suitable for any conductors, even different to conductors with the structure, presented with reference to FIG. 1, of prior-art solutions. Such conductors may be formed by any technique known in the art, especially by printing a conductive ink using a screen-printing technique or a stencil.

In particular, the invention may be implemented on a photovoltaic device comprising a wafer, comprising a plurality of first conductors oriented in a first direction, these first conductors being discontinuous, as described above, and comprising at least one strip 13, according to the invention, electrically connecting first conductors to one another in discontinuous zones, without a bus or other intermediate conductor being present. The latter discontinuous zones may be aligned in a second direction different to the first direction, so that the strip 13 extends from one end of the wafer to the other in this second direction while electrically connecting the discontinuous zones of the various first conductors.

The invention also relates to a process for producing electrical conductors on a wafer 11 of a photovoltaic device such as described above, which comprises the following steps:

printing a layer of conductive ink on the surface of the wafer 11 so as to form a plurality of electrical conductors; and fastening a metal strip of the type made of copper to at least one electrical conductor, this metal strip comprising fastening zones 114 in which it is mechanically and electrically connected to the electrical conductor, and non-connected zones 115 in which the metal strip is not mechanically fastened to the electrical conductor.

The process advantageously comprises a prior step of preforming the metal strip using a punching tool or by embossing, as was explained above.

In addition, the invention also relates to a process for manufacturing a photovoltaic cell, noteworthy in that it comprises producing an electrical conductor on a wafer using the process described above.

The invention has been described for an implementation on collecting conductors of a photovoltaic cell, and more particularly for the connection of a number of metal strips to each bus of the cell, i.e. in general two or three buses. It is also applicable if the buses take the form of sheets. As a variant, it remains applicable to any photovoltaic structure, for any electrical conductors, and to any type of photovoltaic cell, and more particularly to any photovoltaic device.

The metal strips thus connected in addition serve to connect the various photovoltaic cells to one another, via the continuity of the strips or by soldering the end of these strips, so as to form photovoltaic modules, then photovoltaic generating arrays.

It will be noted that the embodiments described above use a strip. The latter for example takes the form of a band with a cross section of 1.5 to 2 mm in width and 0.2 mm in thickness. This geometry however retains a certain stiffness, which may induce excessive stresses under expansion effects in certain particular photovoltaic-cell geometries and/or particular uses. To respond to this technical problem, one solution consists in using a metal braid, for example a copper braid.

Figure 18:
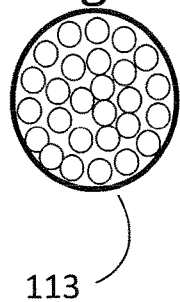
FIGS. 18 to 20 illustrate three examples of multi-strand metal braid cross sections according to one embodiment of the invention.
Figure 19:
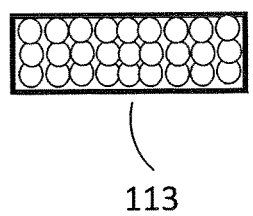
Figure 20:
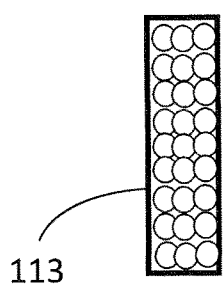

FIGS. 18 to 20 thus illustrate, by way of example, the cross section of three braids 113, which are multi-strand electrical cables, made up of a multitude of conductive strands of small cross section, the overall conductive cross section of the braid remaining equivalent to that of a strip. Thus, such a braid 113 has a conductivity that is equivalent to that of a strip 13, but it is more flexible.

In addition, the flexibility of the braid may be chosen:
the diameter of the strands is one first important factor—the smaller this diameter, the greater the flexibility. It is for example possible to use a diameter of 0.15 mm so as to obtain a high flexibility; and
in addition, the distribution of the strands over the cross section of the braid allows certain axes of flexibility to be favoured. The braid in FIG. 18 has multidirectional flexibility, that in FIG. 19 vertical flexibility and that in FIG. 20 horizontal flexibility.

Such a braid may be fastened to a photovoltaic cell by adhesive bonding or soldering in the fastening zones 114, as described above.

In the case of soldering, it is necessary to guarantee sufficient contact between the solder, such as tin, used for the soldering and all the strands, in order to prevent one or more strands from remaining electrically isolated. At the same time, an excessive amount of tin must not be used in order not to stiffen the braid excessively. To achieve a good compromise, a process for fastening a braid by soldering comprises a step of increasing the solderability of the braid only in the fastening zones. To do this, one solution consists in deoxidizing the copper of the strands only in the fastening zones 114, just before the soldering, in order to promote the soldering of these zones, whereas the other zones remain much less suitable for soldering. This deoxidation may be achieved with a flow of liquid deposited for example with a syringe or by dabbing.

Figure 21:
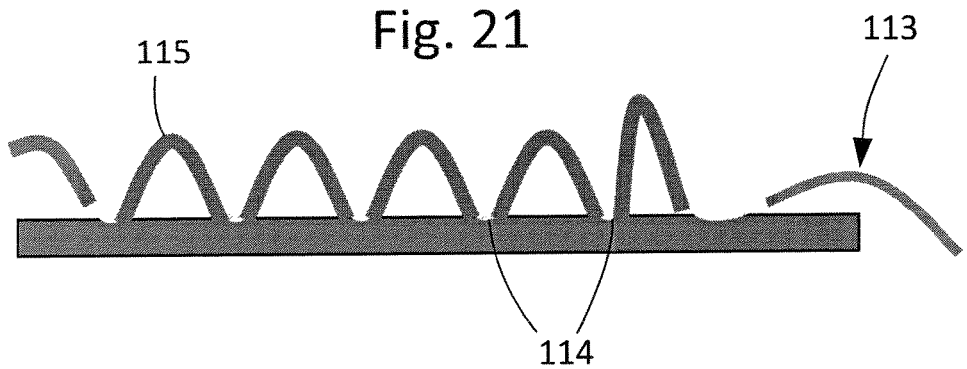
FIG. 21 schematically illustrates soldering of a braid on a photovoltaic cell according to a first embodiment of the invention.

This fastening process may comprise a prior step of removing a protective coating, such as a lacquer, or exposing the copper strands in the fastening zones 114 in order to obtain the configuration illustrated in FIG. 21.

In addition, to further increase the electrical effectiveness of the soldering, the braid, or at least its parts in the fastening zones, may be pre-tinned by dipping in a bath of liquid tin, or by electrolysis, before the tin-based soldering per se.

Figure 22:
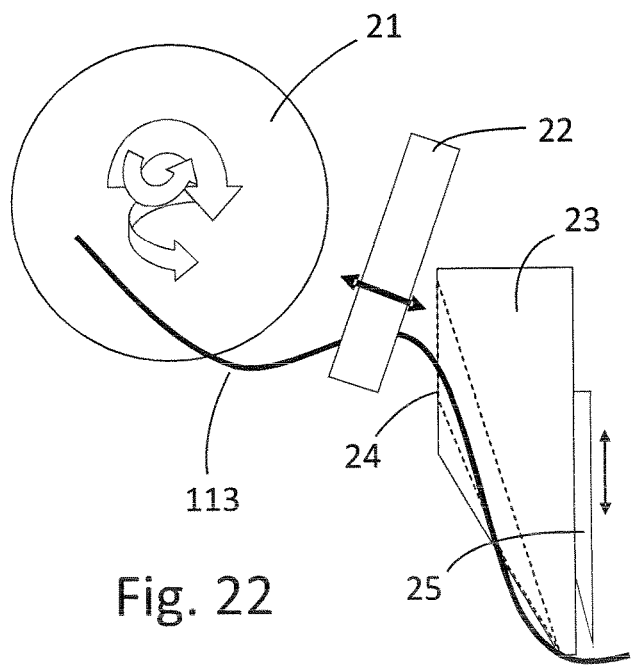
FIG. 22 shows a device for soldering a braid on a photovoltaic cell according to a first embodiment of the invention.
Figure 23:
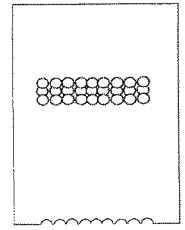
FIGS. 23 to 25 show three variant thermodes for a device for soldering a braid on a photovoltaic cell according to one embodiment of the invention.
Figure 24:
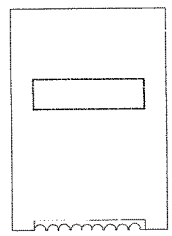
Figure 25:
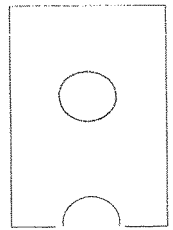

FIG. 22 illustrates a device allowing the soldering of a braid 113 to a photovoltaic cell to be automatically and easily carried out. This device comprises a wire unwinder 21, a gripper 22 for breaking the wire, a thermode 23 comprising a wire-guide 24 and a blade 25 for cutting the wire. Such a device may treat the various strands of the braid separately. In such a case, the thermode has the shape shown in FIG. 23. As a variant, when the braid comprises a plastic sheath, the thermode is tailored to the geometry of the braid, and its cross section may be as shown in FIG. 24 for a rectangular sheathed braid, or as shown in FIG. 25 for a circular sheathed braid.

The invention claimed is:

1. A photovoltaic device comprising a wafer, said photovoltaic device comprising:
    a plurality of discontinuous first conductors separated by a first constant pitch, the plurality of first conductors oriented in a same first direction, wherein the first conductors are discontinuous in respective interconnection zones, each first conductor comprising two segments, each segment having two respective ends, wherein the two segments are separated by a gap disposed in the respective interconnection zone; and
    at least one metal strip oriented in a second direction that is different from the first direction and constituting at least one second conductor fastened to the first conductors, the at least one metal strip comprising fastening zones located in the respective interconnecting zones, said fastening zones being distributed with a second constant pitch, said second pitch being an integer multiple of the first pitch,
    wherein the at least one metal strip is mechanically and electrically connected to the first conductors and wherein the at least one metal strip is connected to non-connected zones in which it is not mechanically fastened to the first conductors,
    wherein the at least one metal strip directly electrically connects the two segments of the first conductors to one another in each of the respective interconnection zones of said first conductors, and
    wherein the metal strip is mechanically and electrically connected in each fastening zone to a number of first conductors in their interconnecting zones equal to the ratio of the second pitch to the first pitch, such that the metal strip is directly connected to all of the first conductors.

2. The photovoltaic device according to claim 1, wherein the metal strip is strip-shaped.

3. The photovoltaic device according to claim 1, wherein the end of the first conductors, at their discontinuous part in an interconnection zone, forms electrical connectors that are wider than the width of the first conductors outside of the interconnection zones, and in that the interconnection zones are aligned in the second direction so that the second conductor extends from one end of the wafer to another end of the wafer in the second direction, thereby connecting the aligned interconnection zones.

4. The photovoltaic device according to claim 1, wherein each first conductor takes the form of a plurality of segments that are aligned in the first direction, said segments having a space between them in the interconnection zones.

5. The photovoltaic device according to claim 1, wherein a space between the first conductors in the interconnection zones is greater than or equal to 0.25 mm.

6. The photovoltaic device according to claim 1, wherein each first conductor has a width less than 0.12 mm outside of the interconnection zones.

7. The photovoltaic device according to claim 1, wherein each first conductor extends from one end of the wafer to another end of the wafer in the first direction.

8. The photovoltaic device according to claim 3, wherein the electrical connectors have a width of 0.2 mm or more, and/or a length of 0.4 mm or more and/or a rectangular shape.

9. The photovoltaic device according to claim 1, comprising metallized lands in the interconnection zones, which metallized lands are separate from the first conductors and ensure the mechanical strength of the at least one second conductor.

10. The photovoltaic device according to claim 1, wherein the at least one second conductor is one element of the group comprising the metal strip that is striped shaped and a braid, which covers the two ends of a first conductor at a discontinuity in the interconnection zone and which covers a plurality of interconnection zones to electrically connect two or more first conductors.

11. The photovoltaic device according to claim 1, wherein the first conductors take the form of a single discontinuous printed ink layer, or the form of two printed ink layers that are superposed and discontinuous in a vertical direction.

12. The photovoltaic device according to claim 1, wherein the at least one metal strip comprises an alternation of fastening zones and non-connected zones.

13. The photovoltaic device according to claim 1, wherein at least one non-connected zone is included between two fastening zones and a length of the metal strip in the non-connected zone is greater than a distance between the two fastening zones.

14. The photovoltaic device according to claim 1, wherein the metal strip is fastened by a conductive fastening means in a fastening zone, the fastening means being a solder or a conductive adhesive.

15. The photovoltaic device according to claim 1, wherein the at least one metal strip extends across the entire wafer and beyond in order to enable a plurality of photovoltaic devices to be electrically connected to one another.

16. The photovoltaic device according to claim 1, wherein the photovoltaic device is a photovoltaic cell and the first conductors are collecting conductors of the photovoltaic cell.

17. The photovoltaic device according to claim 16, wherein the collecting conductors are parallel collecting conductors, and the fastening zones are superposed on the collecting conductors.

18. The photovoltaic device according to claim 17, wherein a distance between two interconnection zones (I) lies in a range of p−20% p≤I≤p, where p is the first constant pitch of the collecting conductors.

19. A photovoltaic module comprising a plurality of photovoltaic cells taking the form of a photovoltaic device according to claim 1.

20. A photovoltaic array comprising a plurality of photovoltaic modules according to claim 19.

21. A method for producing electrical conductors on a wafer of a photovoltaic device, comprising:
    printing a layer of conductive ink on the surface of the wafer to form a plurality of first conductors in a first direction separated by a first constant pitch, the plurality of first conductors are discontinuous in respective interconnection zones, each first conductor comprising two segments, each segment having two respective ends, wherein the two segments are separated by a gap disposed in the respective interconnection zone; and
    fastening a metal strip, oriented in a second direction that is different from the first direction, to the plurality of first conductors such that the metal strip is directly connected to all of the first conductors, the metal strip comprising fastening zones located in the respective interconnecting zones, said fastening zones being distributed with a second constant pitch, said second pitch being an integer multiple of the first pitch,
    wherein the metal strip is mechanically and electrically connected to the first conductors, wherein the metal strip is connected to non-connected zones in which the metal strip is not mechanically fastened to the first conductors, wherein the metal strip directly electrically connects the two segments of the first conductors to one another in each of the respective interconnection zones of said first conductors, and wherein the metal strip is mechanically and electrically connected in each fastening zone to a number of first conductors in their interconnecting zones equal to the ratio of the second pitch to the first pitch.

22. The method for producing electrical conductors on a wafer of a photovoltaic device according to claim 21, comprising:

printing a layer of conductive ink on the surface of the wafer through a metal stencil, to form the plurality of first conductors.

23. The method for producing electrical conductors on a wafer according to claim 21, wherein the fastening zones of the metal strip are obtained by soldering or bonding with a conductive adhesive.

24. The method for producing an electrical conductor on a wafer according to claim 23, wherein the method comprises a prior step of preforming the metal strip using a punching tool or by embossing.

25. The method for producing an electrical conductor on a wafer according to claim 23, wherein the method comprises a step of soldering deoxidized zones of a braid in the fastening zones.

26. The photovoltaic device according to claim 1, wherein the metal strip is braid-shaped.

27. The photovoltaic device according to claim 1, wherein a distance between two interconnection zones (I) lies in a range of p−20% p≤I≤p, where p is the first constant pitch of the collecting conductors.

28. A photovoltaic device comprising a wafer, said photovoltaic device comprising:

a plurality of discontinuous first conductors separated by a first constant pitch, the plurality of first conductors oriented in a same first direction, wherein the first conductors are discontinuous in respective interconnection zones, each first conductor comprising two segments, each segment having two respective ends, wherein the two segments are separated by a gap disposed in the respective interconnection zone; and a second conductor consisting of a metal strip oriented in a second direction that is different from the first direction, the metal strip mechanically and electrically connected to the first conductors at fastening zones located in the respective interconnecting zones, said fastening zones being distributed with a second constant pitch, said second pitch being an integer multiple of the first pitch, wherein the metal strip electrically connects the two segments of the first conductors to one another in each of the respective interconnection zones of said first conductors, and wherein the metal strip is mechanically and electrically connected in each fastening zone to a number of first conductors in their interconnecting zones equal to the ratio of the second pitch to the first pitch, such that the metal strip is directly connected to all of the first conductors.

29. A photovoltaic device comprising a wafer, said photovoltaic device comprising:

a plurality of discontinuous first conductors, the plurality of first conductors being parallel, separated by a first constant pitch, and oriented in a same first direction, wherein the first conductors are discontinuous in respective interconnection zones, each first conductor comprising two segments, each segment having two respective ends, wherein the two segments are separated by a gap disposed in the respective interconnection zone; and at least one metal strip oriented in a second direction that is different from the first direction and constituting at least one second conductor fastened to the first conductors, the at least one metal strip comprising an alternation of fastening zones and non-connected zones, said fastening zones being distributed with a second constant pitch, said second pitch being an integer multiple of the first pitch of the first conductors, so that the fastening zones are located in the respective interconnecting zones, wherein the metal strip is mechanically and electrically connected in each fastening zone to a number of first conductors in their interconnecting zones equal to the ratio of the second pitch to the first pitch, wherein the at least one metal strip is mechanically and electrically connected to the first conductors in the respective interconnecting zones and wherein the at least one metal strip is connected to non-connected zones in which it is not mechanically fastened to the first conductors, wherein the at least one metal strip directly electrically connects the two segments of the first conductors to one another in each of the respective interconnection zones of said first conductors, such that the metal strip is directly connected to all of the first conductors.

* * * * *